United States Patent
Holzleitner et al.

(10) Patent No.: US 8,902,003 B2
(45) Date of Patent: Dec. 2, 2014

(54) AMPLIFIER, MOBILE COMMUNICATION DEVICE AND METHOD FOR AMPLIFYING

(71) Applicant: Intel Mobile Communications GmbH, Neubiberg (DE)

(72) Inventors: Josef Holzleitner, Wels (AT); Werner Schelmbauer, Steyr (AT)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/716,936

(22) Filed: Dec. 17, 2012

(65) Prior Publication Data

US 2014/0167846 A1   Jun. 19, 2014

(51) Int. Cl.
   *H03F 3/42* (2006.01)

(52) U.S. Cl.
   CPC .................................. *H03F 3/42* (2013.01)
   USPC ......................................... 330/150; 330/310

(58) Field of Classification Search
   USPC .................... 330/252–261, 310, 98, 133, 150
   See application file for complete search history.

(56) References Cited

U.S. PATENT DOCUMENTS

| | | | |
|---|---|---|---|
| 6,384,685 B1 * | 5/2002 | Juang ............................ | 330/264 |
| 2013/0257535 A1 * | 10/2013 | Mengad ........................ | 330/253 |

* cited by examiner

*Primary Examiner* — Hieu Nguyen
(74) *Attorney, Agent, or Firm* — Eschweiler & Associates, LLC

(57) ABSTRACT

An amplifier includes an amplifying stage configured to provide an amplifier output signal based on a combination of a received amplifying stage input signal and a received amplified version of the amplifying stage input signal.

10 Claims, 12 Drawing Sheets

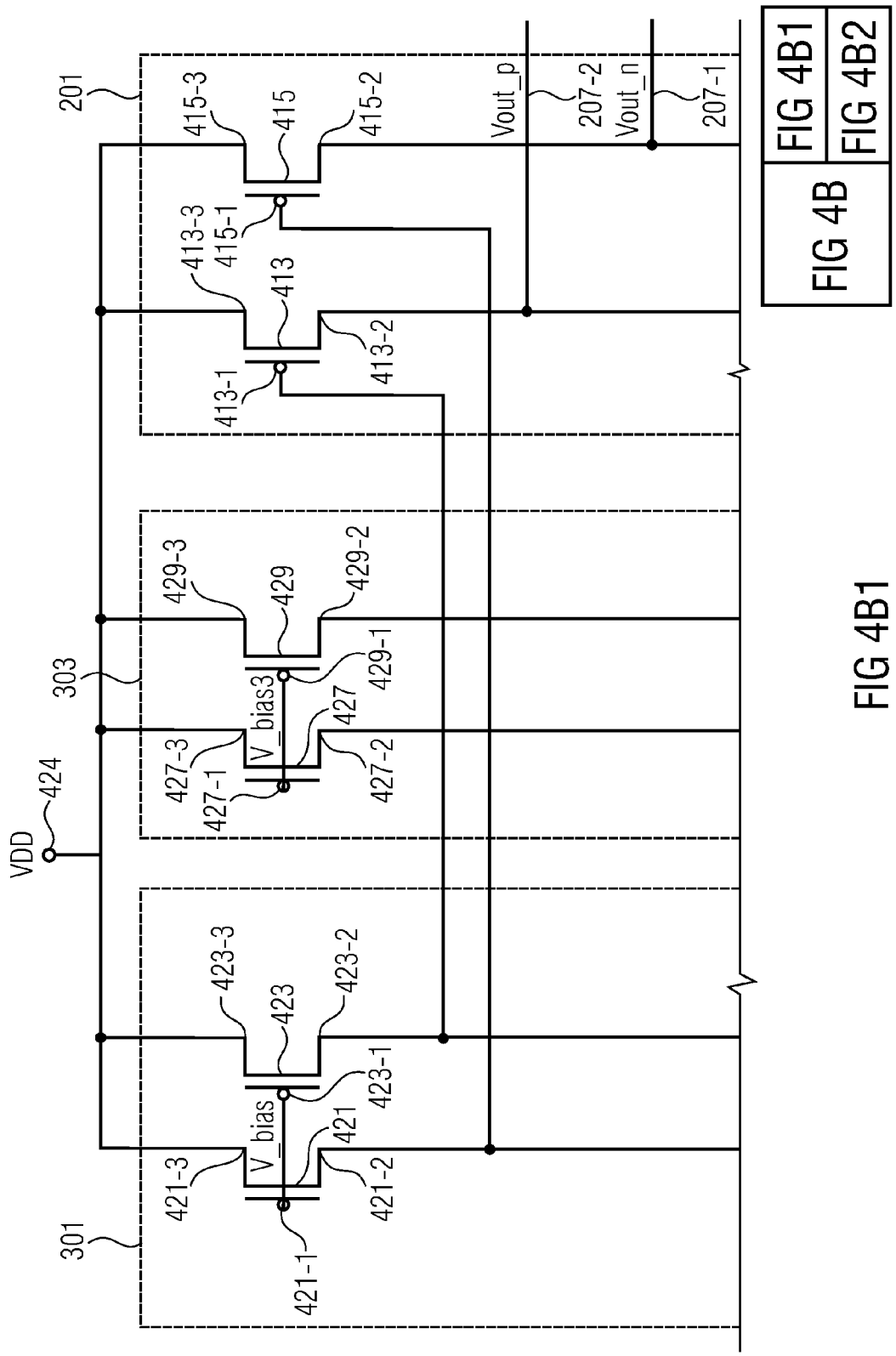
FIG 4B1

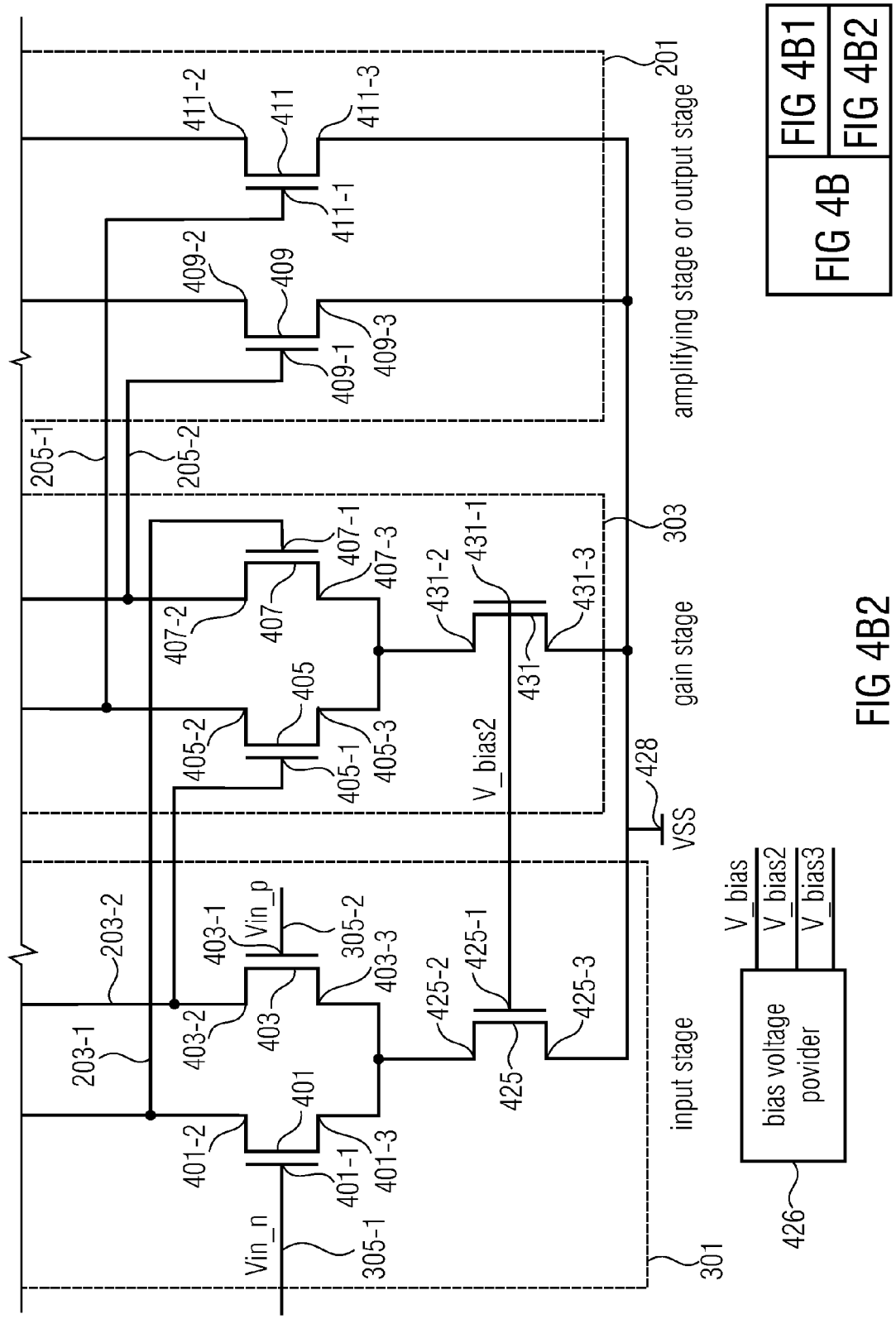
FIG 4B2

AMPLIFIER, MOBILE COMMUNICATION DEVICE AND METHOD FOR AMPLIFYING

FIELD

The present application relates to an amplifier and a method for amplifying. Furthermore, the present application relates to a mobile communication device comprising an amplifier.

BACKGROUND

From a noise and bandwidth point of view, the requirements of a RX-chain baseband GSM/UMTS/LTE active analog filter are somehow contradicting. Generally speaking, a GSM filter needs a very low noise performance with a not so high bandwidth. A UMTS filter needs a remarkably higher bandwidth with a not so good noise performance. A filter for a wideband LTE mode needs even more bandwidth. The filter requirements relate directly to the requirements of the op-amp used in the filter circuit. Available active analog filter implementations solve this problem with two different op-amps. A noise optimized op-amp supports the GSM mode but is not able to support the UMTS mode. A second op-amp supports the UMTS mode but cannot fulfill the GSM noise requirements. This solution inherently has several drawbacks:
  a) Layout and design work overhead for the additional op-amp which leads directly to increased costs.
  b) Layout area overhead for an additional operational op-amp which leads directly to increased costs.
  c) One op-amp is always powered off but is connected in parallel to the active op-amp. This leads to parasitic effects with performance degradations.
  d) Due to the lack of a "one fits all" op-amp, two different filter chains in parallel are implemented. The filter input signal is multiplexed to one or the other filter chain. The multiplexer in the signal chain degrades the performance of the receive chain and increases the layout area.

SUMMARY

An amplifier comprises an amplifying stage configured to provide an amplifier output signal based on a combination of a received amplifying stage input signal and a received amplified version of the amplifying stage input signal.

A mobile communication device comprises a digital baseband processor and an amplifier. The amplifier comprises an amplifying stage configured to provide an amplifier output signal based on a combination of a received amplifying stage input signal and a received amplified version of the amplifying stage input signal. Furthermore, the mobile communication device comprises an antenna port. The amplifier is coupled to the digital baseband processor and the antenna port.

A method for amplifying comprises providing an amplifier output signal based on a combination of a received amplifying stage input signal and a received amplified version of the amplifying stage input signal.

BRIEF DESCRIPTION OF THE DRAWINGS

FIG. 4B1 and FIG. 4B2 show another example implementation of the input stage, the gain stage and the amplifying stage shown in FIG. 3, which extends the example implementation shown in FIG. 4A by additional biasing elements;

DETAILED DESCRIPTION

According to one embodiment of the present application, a first terminal of a transistor may be a source terminal or an emitter terminal of the transistor or may be a drain terminal or a collector terminal of the transistor. A second terminal of the transistor may be a drain terminal or a collector terminal of the transistor or may be a source terminal or an emitter terminal of the transistor. A control terminal of the transistor may be a gate terminal or a base terminal of the transistor. Therefore, a switchable path of a transistor may be a drain source path or an emitter collector path of the transistor. A main transistor current is typically routed from the first terminal to the second terminal of the transistor or vice versa.

Figure 1:
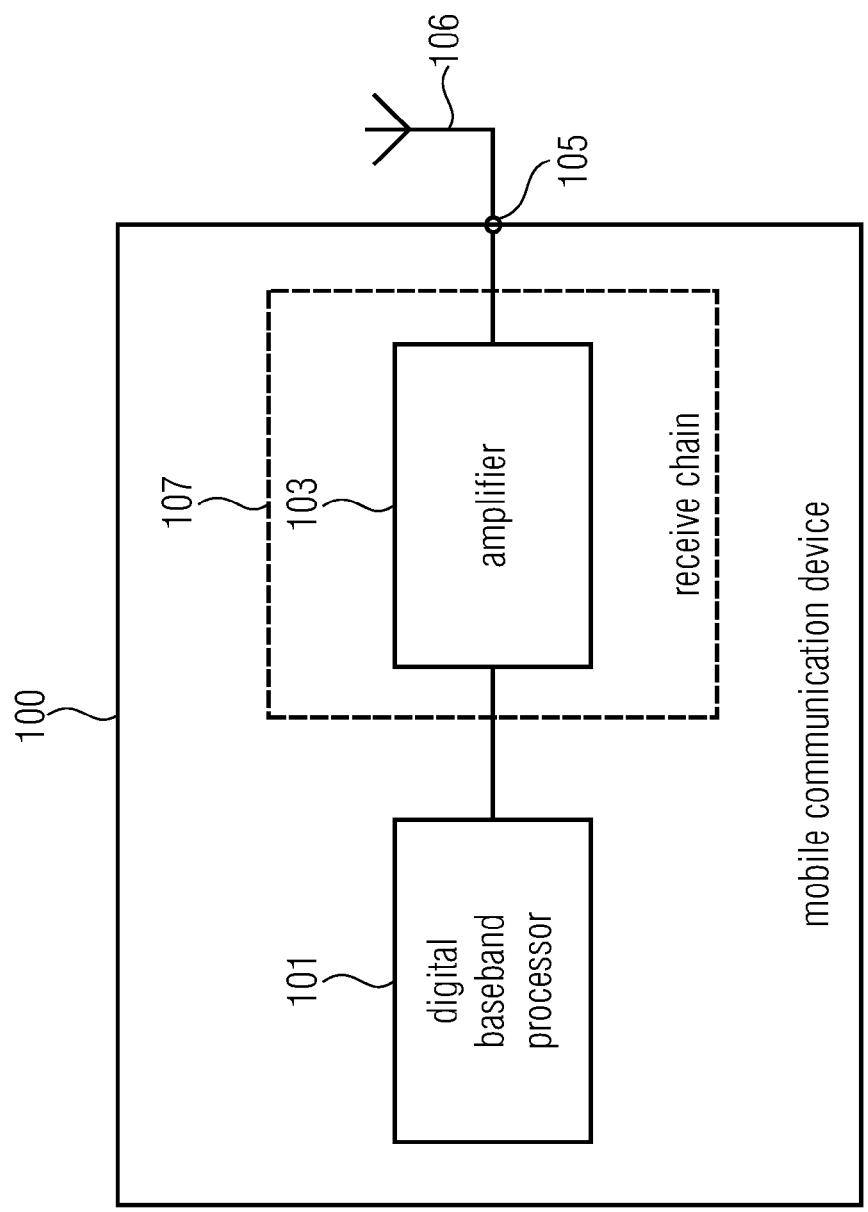
FIG. 1 shows an example mobile communication device comprising an amplifier.

FIG. 1 shows an example mobile communication device 100. The mobile communication device 100 comprises a digital baseband processor 101, an example amplifier 103 and an antenna port 105, for example, for connecting to an antenna 106. Different example implementations of the amplifier 103 will be described in the following in conjunction with FIGS. 2 to 6d.

As will be described in the following, an advantage of the amplifier 103 is that it combines a very good noise performance and gain bandwidth product (e.g. to be used in a negative feedback filter application with sufficient phase margin). Furthermore, as will be seen in the following, the amplifier 103 can achieve a Bode phase plot where the phase rolls over only to approximately 140° until the gain is attenuated to 0 dB (which leads to a phase margin of 40°) without any additional frequency compensation. The amplifier 103 enables a truly multimode filter with only one type of operational amplifier. As the amplifier 103 combines a very good noise performance with a very wide bandwidth, it can be achieved that in the mobile communication device 100 it is no longer necessary to provide a first amplifier (e.g. for amplifying GSM signals) which is noise optimized and a second amplifier (e.g. for amplifying UMTS and/or LTE signals)

which has a remarkably higher bandwidth as the first amplifier, but not as good noise performance as the first amplifier.

Hence, the mobile communication device 100 comprising the amplifier 103 has the advantage over conventional mobile communication devices in that at least one amplifier can be saved, which leads to reduced layout and design efforts. Furthermore, as only one amplifier is sufficient, performance degradations due to parasitic effects between an active amplifier and a parallel inactive amplifier can no longer occur. Furthermore, the described multiplexing of the input signal to one or the other filter chain (to the first amplifier or to the second amplifier) is no longer needed, which leads to degradation in performance and increase of the layout area in conventional amplifiers.

To summarize, the implementation of the amplifier 103 in the mobile communication device 100 leads on the one hand to less design and layout area efforts and on the other hand to a better overall performance of the mobile communication device 100 as parasitic effects due to the parallel use of different amplifiers for different signals and due to the use of multiplexers can be reduced.

As can be seen from FIG. 1, the mobile communication device 100 can optionally comprise a receive chain 107 coupled to the digital baseband processor 101 and the antenna port 105. The amplifier 103 can be comprised in such a receive chain 107. As already described, the amplifier 103 can be used, both for receiving and amplifying, a mobile communication signal according to the GSM standard and even a mobile communication signal according to the UMTS or LTE standard.

Of course it is also possible to implement the amplifier 103 in a transmit chain of the mobile communication device 100 (e.g. for amplifying mobile communication signals which are to be transmitted via the antenna 106).

Although in FIG. 1 the amplifier 103 is presented as part of the mobile communication device 100, this amplifier 103 may also be used in other circuits or devices. In the following different example implementations of such amplifier 103 will be described in more detail.

Figure 2:
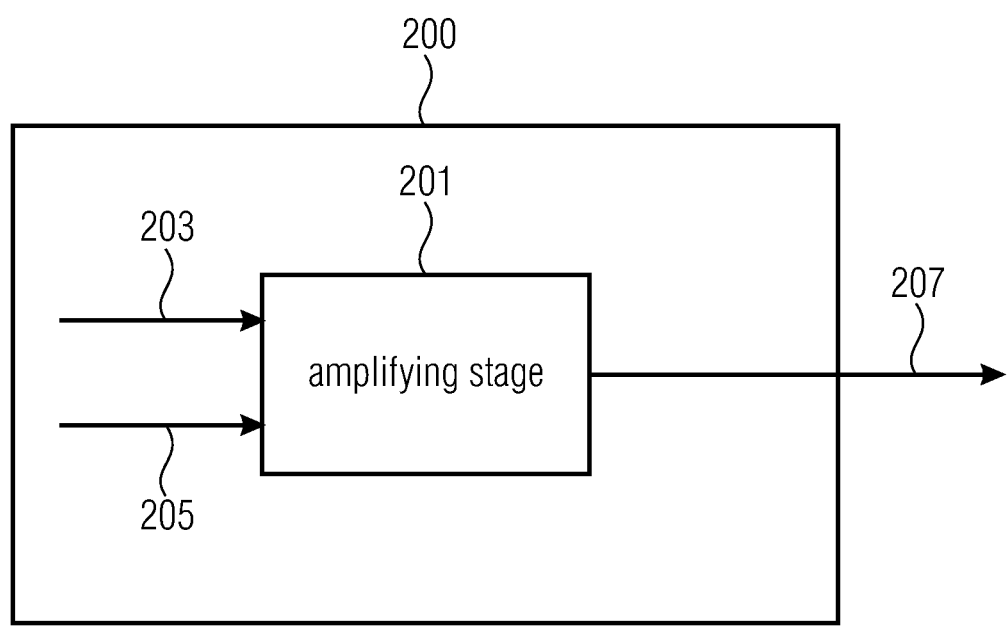
FIG. 2 shows an example amplifier which comprises an amplifying stage.

FIG. 2 shows an example amplifier 200 (which could be the amplifier 103 shown in FIG. 1). The amplifier 200 comprises an amplifying stage 201. The amplifying stage 201 is configured to provide an amplifier output signal 207 based on a combination of a received amplifying stage input signal 203 and a received amplified version 205 of the amplifying stage input signal 203. As already described in conjunction with the mobile communication device 100, the amplifier 200 combines a very good noise performance and gain bandwidth product. This combination of the low noise and high bandwidth is achieved by combining the amplifying stage input stage signal 203 with the amplified version 205 of the amplifying stage input signal 203 to derive the amplifier output signal 207. It has been found that by combining the amplifying stage input signal 203 with the amplified version 205 of the amplifying stage input signal 203 (e.g. by summing up these two signals) a Bode phase plot can be achieved where the phase rolls over to approximately 140° until the gain is attenuated to 0 dB (having a 40° phase margin) without any additional frequency compensation.

The combination of the good noise performance and the gain bandwidth product in the amplifier 200 enables a truly multimode filter with only one type of amplifier (or operational amplifier). Furthermore, when the amplifier 200 is used (e.g. in a mobile communication device) no parasitic capacitive load due to unpowered operational amplifiers in parallel exist anymore, as it is sufficient to have one amplifier for different mobile communication signals (e.g. one amplifier for GSM signals and UMTS or LTE signals). Furthermore, no additional miller compensation is necessary and as a consequence no bandwidth reduction of the amplifier 200 shows up. Furthermore, the amplifier 200 even has enough gain bandwidth for use in the wideband LTE modes and still has sufficient noise performance to be applied in a GSM filter.

Hence, the amplifier 200 provides a very good noise performance in combination with a high gain bandwidth product and a very low current consumption compared to conventional solutions. Therefore, the op-amp or amplifier 200 fulfills the need of a multimode GSM/UMTS/LTE active analog filter design.

In the following, example implementations of the amplifier 200 will be described in more detail.

Figure 3:
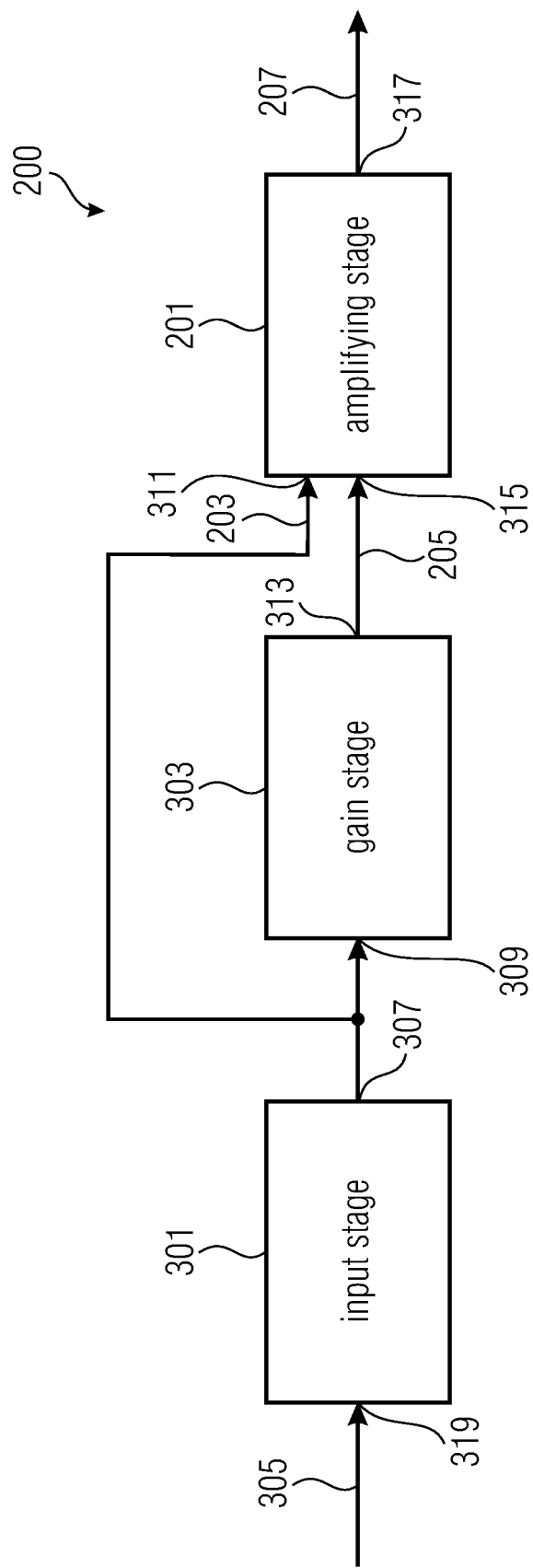
FIG. 3 shows an example implementation of the amplifier shown in FIG. 2 which further comprises an input stage and a gain stage.

FIG. 3 shows such an example implementation of the amplifier 200 extending the amplifier 200 shown in FIG. 2 by an input stage 301 and a gain stage 303. Hence, the example implementation of the amplifier 200 shown in FIG. 3 comprises the input stage 301, the gain stage 303 and the amplifying stage 201. The input stage 301 is configured to receive an amplifier input signal 305 and to provide based on the received amplifier input signal 305 the amplifying stage input signal 203 as an amplified version of the amplifier input signal 305. Furthermore, the gain stage 303 is configured to receive the amplifying stage input signal 203 and provide, based on the received amplifying stage input signal 203, the amplified version 205 of the amplifying stage input signal 203. Hence, the gain stage 303 is configured to receive the amplifying stage input signal 203 and amplify the amplifying stage input signal 203 to derive the amplified version 205 of the amplifying stage input signal 203. From FIG. 3 it can be seen that the amplifying stage input signal 203 is provided in an unamplified version as the amplifying stage input signal 203 itself and in the amplified version 205 of the amplifying stage input signal 203. In other words, the output of the input stage 301 (the amplifying stage input signal 203) is additionally amplified with the gain stage 303 which acts as a parallel path to the output signal of the input stage 301. Hence, from FIG. 3 it can be seen that an output 307 of the input stage 301 is on the one hand connected to an input 309 of the gain stage 303 and on the other hand to a first input 311 of the amplifying stage 201. An output 313 of the gain stage 303, at which the gain stage 303 provides the amplified version 205 of the amplifying stage input signal 203 is connected to a second input 315 of the amplifying stage 201. An output 317 of the amplifying stage 201, at which the amplifying stage 201 provides the amplifier output signal 207 also forms an output of the amplifier 200. An input 319 of the input stage 301, at which the input stage 301 receives the amplifier input signal 305 also forms an input of the amplifier 200.

The output signals of the input stage 301 and the gain stage 303 (i.e. the amplifying stage input signal 203 and the amplified version 205 of the amplifying stage input signal 203) are combined (e.g. summed up) by the amplifying stage 201 to derive the amplifier output signal 207. This multipath concept with the combining (e.g. the summing up) of the two output signals 203, 205 of the input stage 301 and the gain stage 303 leads to a Bode phase plot where the phase rolls over only to approximately 140° until the gain is attenuated to 0 dB (with a 40° phase margin) without any additional frequency compensation. The described Bode phase rollover behavior can depend on the relationship of several poles and zeros in the described circuit or amplifier 200.

Figure 4A:
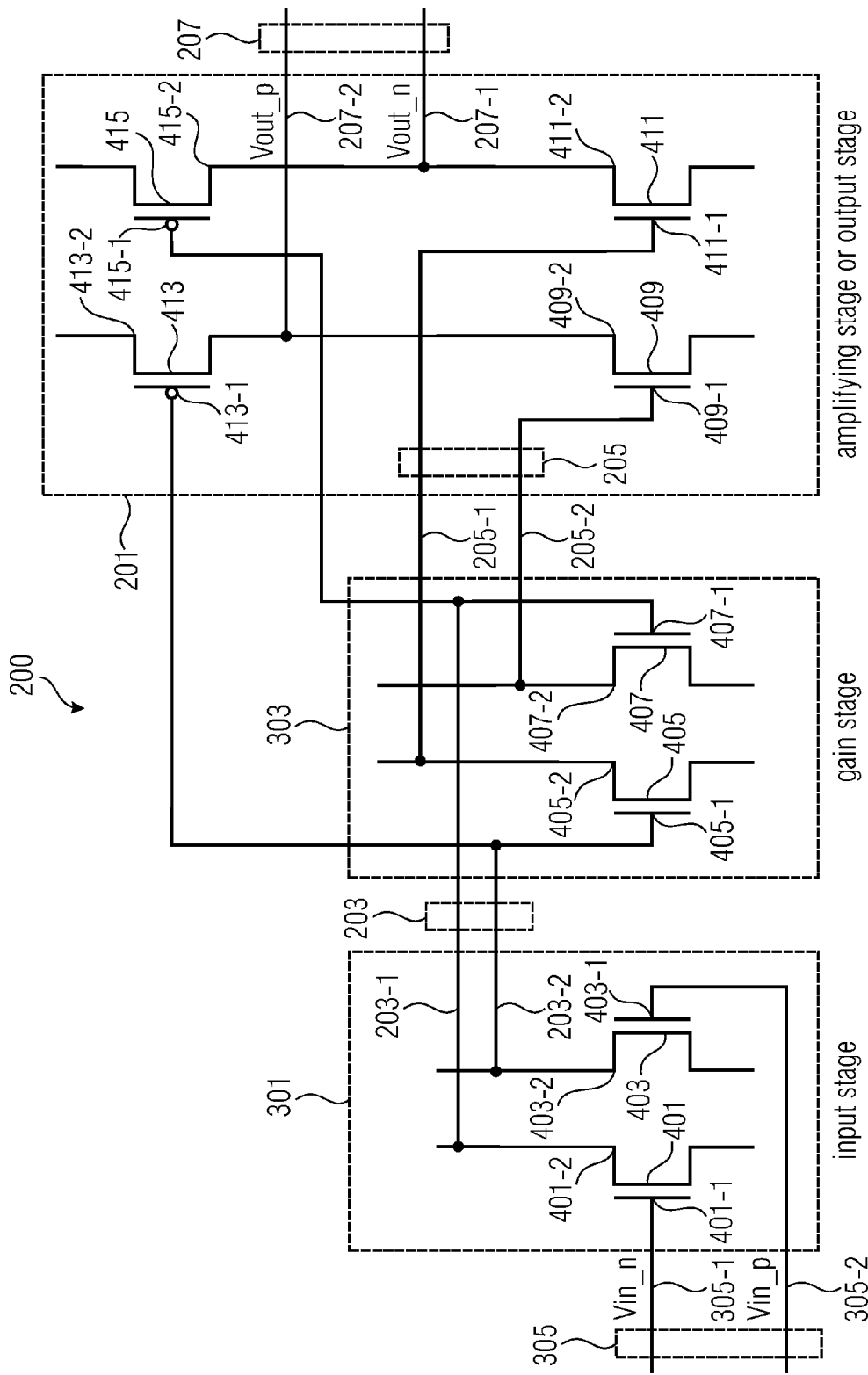
FIG. 4A shows an example implementation of the input stage, the gain stage and the amplifying stage shown in FIG. 3.

FIG. 4A shows example implementations for the input stage 301, the gain stage 303 and the amplifying stage 201. In FIG. 4A a possible bias provider, supply potential providers or ground potential providers are not shown for clarity reasons.

Although the example implementation of the amplifier 200 shown in FIG. 4A is a differential implementation, in a further example implementation of the amplifier 200, the amplifier 200 could also be a single ended amplifier (which is configured to receive a single ended amplifier input signal and to provide a single ended amplifier output signal).

The input stage 301 comprises a first transistor 401 of a first type of transistors (e.g. NMOS) and a second transistor 403 of the first type of transistors. The first transistor 401 is configured to receive at its control terminal 401-1 a first differential component 305-1 of the amplifier input signal 305, the first differential component 305-1 of the amplifier input signal 305 can also be designated as Vin_n. Furthermore, the first transistor 401 is configured to provide at its first terminal 401-2 a first differential component 203-1 of the amplifying stage input signal 203. The second transistor 403 is configured to receive at its control terminal 403-1 a second differential component 305-2 of the amplifier input signal 305. The second differential component 305-2 of the amplifier input signal 305 can also be designated as Vin_p. Furthermore, the second transistor 403 is configured to provide at its first terminal 403-2 a second differential component 203-2 of the amplifying stage input signal 203. An output signal of the input stage 301 is therefore the amplifying stage input signal 203 as a differential signal comprising the first differential component 203-1 and the second differential component 203-2 of the amplifying stage input signal 203. The first terminals 401-2, 403-2 of the first transistor 401 and the second transistor 403 therefore form the output 307 of the input stage 301. The control terminals 401-1, 403-1 of the first transistor 401 and the second transistor 403 form the input 319 of the input stage 301 and therefore also the input of the amplifier 200. In a single ended implementation of the amplifier 200, one of the transistors 401-1, 403-1 could be omitted.

The gain stage 303 comprises a third transistor 405 of the first type of transistors and a fourth transistor 407 of the first type of transistors. The third transistor 405 is configured to receive at its control terminal 405-1 the second differential component 203-2 of the amplifying stage input signal 203. Hence, the control terminal 405-1 of the third transistor 405 is connected to the first terminal 403-2 of the second transistor 403.

Furthermore, the third transistor 405 is configured to provide at its first terminal 405-2 a first differential component 205-1 of the amplified version 205 of the amplifying stage input signal 203.

The fourth transistor 407 is configured to receive at its control terminal 407-1 the first differential component 203-1 of the amplifying stage input signal 203. Hence, the control terminal 407-1 of the fourth transistor 407 is connected to the first terminal 401-2 of the first transistor 401. Furthermore, the fourth transistor 407 is configured to provide at its first terminal 407-2 a second differential component 205-2 of the amplified version 205 of the amplifying stage input signal 203.

The amplifying stage 201 (which is also an output stage 201 of the amplifier 200) comprises a fifth transistor 409 of the first type of transistors and a sixth transistor 411 of the first type of transistors. Furthermore, the amplifying stage 201 comprises a seventh transistor 413 of a second type of transistors (e.g. PMOS), the second type of transistors being complementary to the first type of transistors. Furthermore, the amplifying stage 201 comprises an eighth transistor 415 of the second type of transistors.

The fifth transistor 409 is configured to receive at its control terminal 409-1 the second differential component 205-2 of the amplified version 205 of the amplifying stage input signal 203. Hence, the control terminal 409-1 of the fifth transistor 409 is connected to the first terminal 407-2 of the fourth transistor 407. Furthermore, a first terminal 409-2 of the fifth transistor 409 is connected to a first terminal 413-2 of the seventh transistor 413. Hence, the seventh transistor 413 and the fifth transistor 409 share a common terminal at which the fifth transistor 409 and the seventh transistor 413 provide a second differential component 207-2 of the amplifier output signal 207. The seventh transistor 413 is configured to receive at its control terminal 413-1 the second differential component 203-2 of the amplifying stage input signal 203. Hence, the control terminal 413-1 of the seventh transistor 413 is connected to the first terminal 403-2 of the second transistor 403 and to the control terminal 405-1 of the third transistor 405.

The sixth transistor 411 is configured to receive at its control terminal 411-1 the first differential component 205-1 of the amplified version 205 of the amplifying stage input signal 203. Hence, the control terminal 411-1 of the sixth transistor 411 is connected to the first terminal 405-2 of the third transistor 405. Furthermore, a first terminal 411-2 of the sixth transistor 411 is connected to a first terminal 415-2 of the eighth transistor 415. Hence, the sixth transistor 411 and the eighth transistor 415 share a common terminal at which the sixth transistor 411 and the eighth transistor 415 provide a first differential component 207-1 of the amplifier output signal 207.

A control terminal 415-1 of the eighth transistor 415 is configured to receive the first differential component 203-1 of the amplifying stage input signal 203. Hence, the control terminal 415-1 of the eighth transistor 415 is connected to the first terminal 401-2 of the first transistor 401 and to the control terminal 407-1 of the fourth transistor 407.

From FIG. 4A it can be seen that the amplifier output signal 207 is based on a superposition (e.g. on a summation) of the amplified version 205 of the amplifying stage input signal 203 and the (unamplified) amplifying stage input signal 203 itself. Furthermore, it can be seen that the first terminals 411-2, 415-2 of the sixth transistor 411 and the eighth transistor 415 can form a first output terminal of the amplifier 200 at which the first differential component 207-1 of the amplifier output signal 207 is provided. Furthermore, the first terminals 409-2, 413-2 of the fifth transistor 409 and the seventh transistor 413 can form a second output terminal of the amplifier 200 at which the second differential component 207-2 of the amplifier output signal 207 is provided. The first differential component 207-1 of the amplifier output signal 207 can also be designated as Vout_n and the second differential component 207-2 of the amplifier output signal 207 can also be designated as Vout_p.

Even though in the implementation shown in FIG. 4A transistors 401 to 415 are used for amplifying, in further example implementations of the amplifier 200 these transistors may be replaced by amplifying elements in general. Hence, in general, the input stage 301 can comprise two amplifying elements 401, 403, the gain stage can comprise a further two amplifying elements 405, 407 and the amplifying stage 201 can comprise two amplifying elements 409, 411 and two further amplifying elements 413, 415. As is for example shown in FIG. 4A, the two amplifying elements 413, 415 can be complementary to the rest of the amplifying elements of the amplifier 200. As an example, for equal input signals at such an amplifying element 409 and a complementary amplifying element 413 an output signal provided by the amplifying element 409 at the common terminal of the amplifying element 409 and 413 is inverse to an output signal provided by the amplifying element 413 at the common terminal.

Such an amplifying element can comprise, as already shown in FIG. 4A, a control terminal (such as a gate or base of a transistor), a first terminal (such as a source or emitter or a drain or a collector) and a second terminal (such as a drain or a collector or a source or an emitter of a transistor).

As an example, such an amplifying element could be a voltage controlled current source. To summarize, in a further example implementation of the amplifier 200 each amplifying element is implemented as a voltage control current source. In such an example implementation voltage controlled current sources which receive the differential components 203-1, 203-2 of the amplifying stage input signal 203 can be complementary to voltage controlled current sources which receive the differential components 205-1, 205-2 of the amplified version 205 of the amplifying stage input signal 203.

From FIG. 4A it can be seen how the amplifier or operational amplifier 200 combines a very good noise performance and gain bandwidth product, for example, to be used in a negative feedback filter application with sufficient phase margin. The combination of the low noise and the high bandwidth is achieved with the low noise differential input stage 301 combined with the additional gain stage 303. The output signals 203-1, 203-2 of the input stage 301 are amplified with the gain stage 303. This gain stage 303 acts additionally to the amplifying stage 201 as a parallel path to the output signals 203-1, 203-2 of the input stage 301. Furthermore, the output signals 203-1, 203-2 of the input stage 301 are summed up with the output signals 205-1, 205-2 of the gain stage 203 in the additional amplifying stage 201 or additional output stage 201. Due to the providing of the amplifying stage input signal 203 on the one hand to the amplifying stage 201 and on the other hand to the gain stage 303 the amplifier 200 can be designated as a multipath amplifier 200 or an amplifier 200 which is based on a multipath concept. Summing up of the two output signals 203, 205 of the input stage 301 and the gain stage 303 leads to a Bode phase plot where the phase rolls over only to approximately 140° until the gain is attenuated to 0 dB (40° phase margin) without any additional frequency compensation. Hence, the amplifier 200 does not comprise or, in other words, misses a capacitance for a frequency or phase compensation. The described Bode phase rollover behavior depends on the relationship of several poles and zeros in the described circuit. However, it has been found by the inventors that the example implementation of the amplifier 200 shown in FIG. 4A leads to a constellation of poles and zeros which achieves the described Bode phase rollover behavior.

Advantages of the amplifier 200 are that now a truly multimode filter with only one type of op-amp can be realized. Furthermore, no parasitic capacitive load due to unpowered op-amps in parallel occurs. Furthermore, no additional miller compensation is necessary and as a consequence no bandwidth reduction shows up. Furthermore, the amplifier 200 offers enough gain bandwidth even for wideband LTE modes and a sufficient noise performance to be applied in a GSM filter. Hence, the amplifier 200 can be used on the one hand for amplifying GSM signals which require a good noise performance and on the other hand also for wideband UMTS and LTE signals which require a high bandwidth.

Hence, FIG. 4A shows a very efficient implementation of a multipath operational amplifier 200. As can be seen from FIG. 4A, only one input stage 301 and an additional gain stage 303 besides the amplifying stage or output stage 201 are sufficient. The combination of poles and zeros in the circuit eliminates the need for an additional capacitive compensation.

FIG. 4B1-4B2 shows a further example implementation of the amplifier 200, which extends the example implementation of FIG. 4A by additional biasing components. For simplicity, no common mode output voltage control and class AB current control shows up in the following implementation example drawing of the amplifier 200.

From FIG. 4B1-4B2 it can be seen that the input stage 301 comprises a first biasing transistor 421 of the second type of transistors and a second biasing transistor 423 of the second type of transistors. A first terminal 421-2 of the first biasing transistor 421 is connected to the first terminal 401-2 of the first transistor 401. A first terminal 423-2 of the second biasing transistor 423 is connected to the first terminal 403-2 of the second transistor 403. Hence, the first biasing transistor 421 is configured to apply an input stage bias to the first terminal 401-2 of the first transistor 401. The second biasing transistor 423 is configured to apply an (other) input stage bias to a first terminal 403-2 of the second transistor 403. A second terminal 421-3 of the first biasing transistor 421 is connected to a supply voltage terminal 424 at which a supply voltage VDD is provided. Furthermore, a second terminal 423-3 of the second biasing transistor 423 is connected to the supply voltage terminal 424.

A control terminal 421-1 of the first biasing transistor 421 is connected to a control terminal 423-1 of the second biasing transistor 423. The control terminals 421-1, 423-1 of the biasing transistors 421, 423 are configured to receive a first bias voltage V_bias. Such a first bias voltage V_bias can be provided by a bias voltage provider 426 of the amplifier 200. Furthermore, the input stage 301 comprises a third biasing transistor 425. A first terminal 425-2 of the third biasing transistor 425 is connected to a second terminal 401-3 of the first transistor 401 and a second terminal 403-3 of the second transistor 403. A second terminal 425-3 of the third biasing transistor 425 is connected to a ground potential terminal 428 at which a ground potential VSS is provided. The third biasing transistor 425 is configured to receive at a control terminal 425-1 a second bias voltage V_bias2 which is provided by the bias voltage provider 426.

Hence, the input stage 301 comprises on the one hand the biasing transistors 421, 423 which are configured to provide the input stage biases to the first terminals 401-2, 403-2 of the first transistor 401 and the second transistor 403, and furthermore the further third biasing transistor 425 which is configured to provide a further input stage bias to the second terminals 401-3, 403-3 of the first transistor 401 and the second transistor 403.

Hence, the first transistor 401 is configured to provide the first differential component 203-1 of the amplifying stage input signal 203 based on the received differential component 305-1 of the amplifier input signal 305 and furthermore based on the input stage bias provided by the first biasing transistor 421 and the further input stage bias provided by the third biasing transistor 425. Furthermore, the second transistor 403 is configured to provide the second differential component 203-2 of the amplifying stage input signal 203 based on the received second differential component 305-2 of the amplifier input signal 305 and based on the input stage bias provided by the second biasing transistor 423 and the further input stage bias provided by the third biasing transistor 425.

Furthermore, the gain stage 303 also comprises such biasing transistors like the input stage 301. In detail, the gain stage 303 comprises a fourth biasing transistor 427 and a fifth biasing transistor 429. The fourth biasing transistor 427 and the fifth biasing transistor 429 are from the second type of transistors. A first terminal 427-2 of the fourth biasing transistor 427 is connected to the first terminal 405-2 of the third transistor 405. A first terminal 429-2 of the fifth biasing transistor 429 is connected to the first terminal 407-2 of the fourth transistor 407. A second terminal 427-3 of the fourth biasing transistor 427 is connected to the supply voltage terminal 424. A second terminal 429-3 of the fifth biasing transistor 429 is also connected to the supply voltage terminal 424. A control terminal 427-1 of the fourth biasing transistor 427 is connected to a control terminal 429-1 of the fifth biasing transistor 429. The biasing transistors 427, 429 are configured to receive at their control terminals 427-1, 429-1 a third bias voltage V_bias3 which is provided by the bias voltage provider 426.

Furthermore, the gain stage 303 comprises a (further) sixth biasing transistor 431. A first terminal 431-2 of the sixth biasing transistor 431 is connected to the second terminal 405-3 of the third transistor 405 and the second terminal 407-3 of the fourth transistor 407. A second terminal 431-3 of the sixth biasing transistor 431 is connected to the ground potential terminal 428. A control terminal 431-1 of the sixth biasing transistor 431 is connected to the control terminal 425-1 of the third biasing transistor 425 and is configured to receive the second bias voltage V_bias2. Hence, the third biasing transistor 425 and the sixth biasing transistor 431 are configured to receive the same bias voltage V_bias2 from the bias voltage provider 426. Hence, it can be seen that the control terminals 425-1, 431-2, bias are connected to each other such that they receive the same control signal (the same second bias voltage V_bias2) based on which the biasing transistors 425, 431 provide the further input stage bias and the further gain stage bias.

It can be seen that the biasing transistors 427, 429 are configured to provide a gain stage bias to the first terminal 405-2 of the third transistor 405 and the first terminal 407-2 of the fourth transistor 407. Furthermore, the sixth biasing transistor 431 is configured to provide a further gain stage bias to the second terminals 405-3, 407-3 of the transistors 405, 407.

Hence, the third transistor 405 is configured to provide based on the received second differential component 203-2 of the amplifying stage input signal 203 and the gain stage bias provided by the fourth biasing transistor 427 and the further gain stage bias provided by the sixth biasing transistor 431 the first differential component 205-1 of the amplified version 205 of the amplifying stage input signal 203.

Furthermore, the fourth transistor 407 is configured to provide based on the received first differential component 203-1 of the amplifying stage input signal 203 and based on the gain stage bias provided by the fifth biasing transistor 429 and the further gain stage bias provided by the sixth biasing transistor 431, the second differential component 205-2 of the amplified version 205 of the amplifying stage input signal 203.

By controlling V_bias3 the quiescent current in the output stage 201 can be controlled. By controlling V_bias the common mode output voltage of the output stage 201 can be controlled. By controlling V_bias2 the current in the differential input stage 301 and gain stage 303 is controlled.

In a further example implementation V_bias2 is split in 2 signals to enable 2 different currents in the input stage 301 and gain stage 303. Hence, in this further implementation the bias voltage provider 426 is configured to provide a bias voltage V_bias2_a to the control terminal 425-1 of the third biasing transistor 425 and another (e.g. different) bias voltage V_bias2_b to the control terminal 431-1 of the sixth biasing transistor 431.

Furthermore, it can be seen from FIG. 4B1-4B2 that such biasing transistors or biasing elements provided in the input stage 301 and the gain stage 303 are not needed in the amplifying stage 201. Hence, in the amplifying stage 201 a second terminal 413-3 of the seventh transistor 413 is connected to the supply voltage terminal 424. Furthermore, a second terminal 415-3 of the eighth transistor 415 is connected to the supply voltage terminal 424. Furthermore, a second terminal 409-3 of the sixth transistor 409 is connected to the ground potential terminal 428. A second terminal 411-3 of the sixth transistor 411 is connected to the ground potential terminal 428. Nevertheless, in further example implementations of the amplifier 200 biasing elements may be provided between the second terminals 413-3, 415-3 of the seventh and eighth transistors 413, 415 and the supply voltage terminal 424. Furthermore, a further biasing element may be provided between the second terminals 409-3, 411-3 of the fifth and sixth transistors 409, 411 and the ground potential terminal 428.

Although in the example shown in FIG. 4B1-4B2 biasing transistors 421 to 431 are used for providing the input stage bias, the further input stage bias, the gain stage and the further gain stage bias, in further example implementations of the amplifier 200, in general biasing elements could be used which could even be implemented differently than the single biasing transistors shown in FIG. 4B1-4B2. As an example, instead of using such biasing transistors, in general voltage controlled current sources could be used. In such a case, voltage control current sources, which are used for providing the input stage bias and the gain stage bias, could be complementary to the voltage control current sources which are used for providing the further input stage bias and the further gain stage bias.

Figure 5:
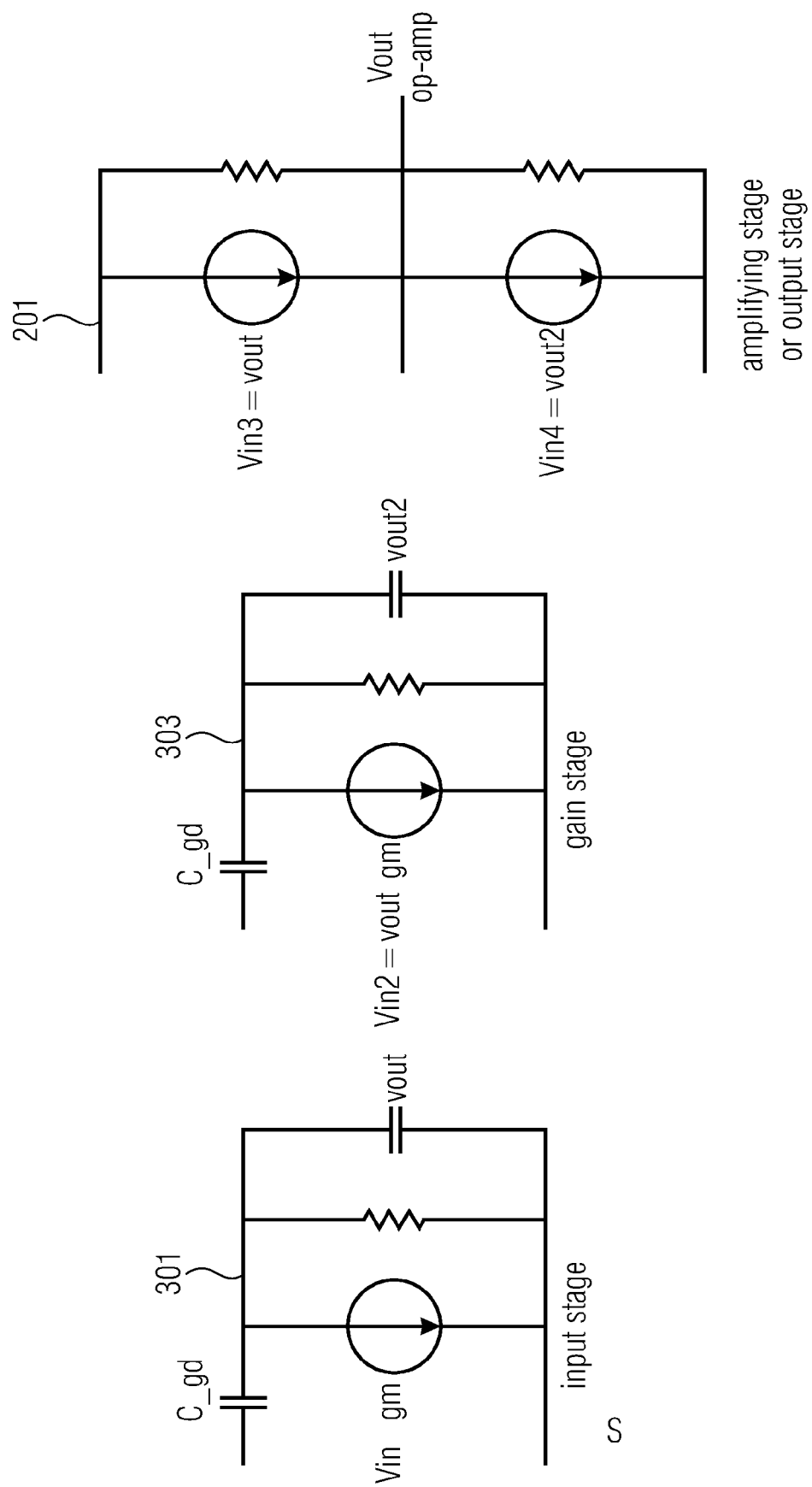
FIG. 5 shows small signal models for the example implementations of the input stage, the gain stage and the amplifying stage as shown in FIG. 4A and FIG. 4B1-4B2.

FIG. 5 shows the basic chain of gain stages and the signal combination with small signal diagrams for the input stage 301, the gain stage 303 and the amplifying stage 201. The input stage 301 and the gain stage 303 are modeled with a first order zero and a first order pole to reduce the complexity. The output stage or the amplifying stage 201 is modeled without a frequency dependent behavior. The small signal analysis leads to the following equations:

s-domain transfer function of the operational amplifier with ideal output stage (no frequency dependent behavior) but gain A3:

$$\mathrm{trf\_opa\_full}(s) := \frac{\left(1 - \frac{s}{\mathrm{vcz\_gain}}\right)\left(1 - \frac{s}{\mathrm{vcz\_in}}\right) A1A2A3}{\left(\frac{s}{\mathrm{vcp\_gain}} + 1\right)\left(\frac{s}{\mathrm{vcp\_in}} + 1\right)} + \frac{\left(1 - \frac{s}{\mathrm{vcz\_in}}\right) A1A3}{\frac{s}{\mathrm{vcp\_in}} + 1},$$

s-domain denominator of the transfer function:

$$\mathrm{trf\_opa\_denom}(s) := \frac{1}{\left(\frac{s}{\mathrm{vcp\_gain}} + 1\right)\left(\frac{s}{\mathrm{vcp\_in}} + 1\right)^2},$$

and
s-domain numerator of the transfer function:

$$\mathrm{trf\_opa\_nom}(s) := A1A2A3\left(\frac{s}{\mathrm{vcp\_in}} + 1\right)\left(1 - \frac{s}{\mathrm{vcz\_gain}}\right)\left(1 - \frac{s}{\mathrm{vcz\_in}}\right) +$$

$$A1A3\left(1 - \frac{s}{\text{vcz\_in}}\right)\left(\frac{s}{\text{vcp\_gain}} + 1\right)\left(\frac{s}{\text{vcp\_in}} + 1\right).$$

Figure 6A:
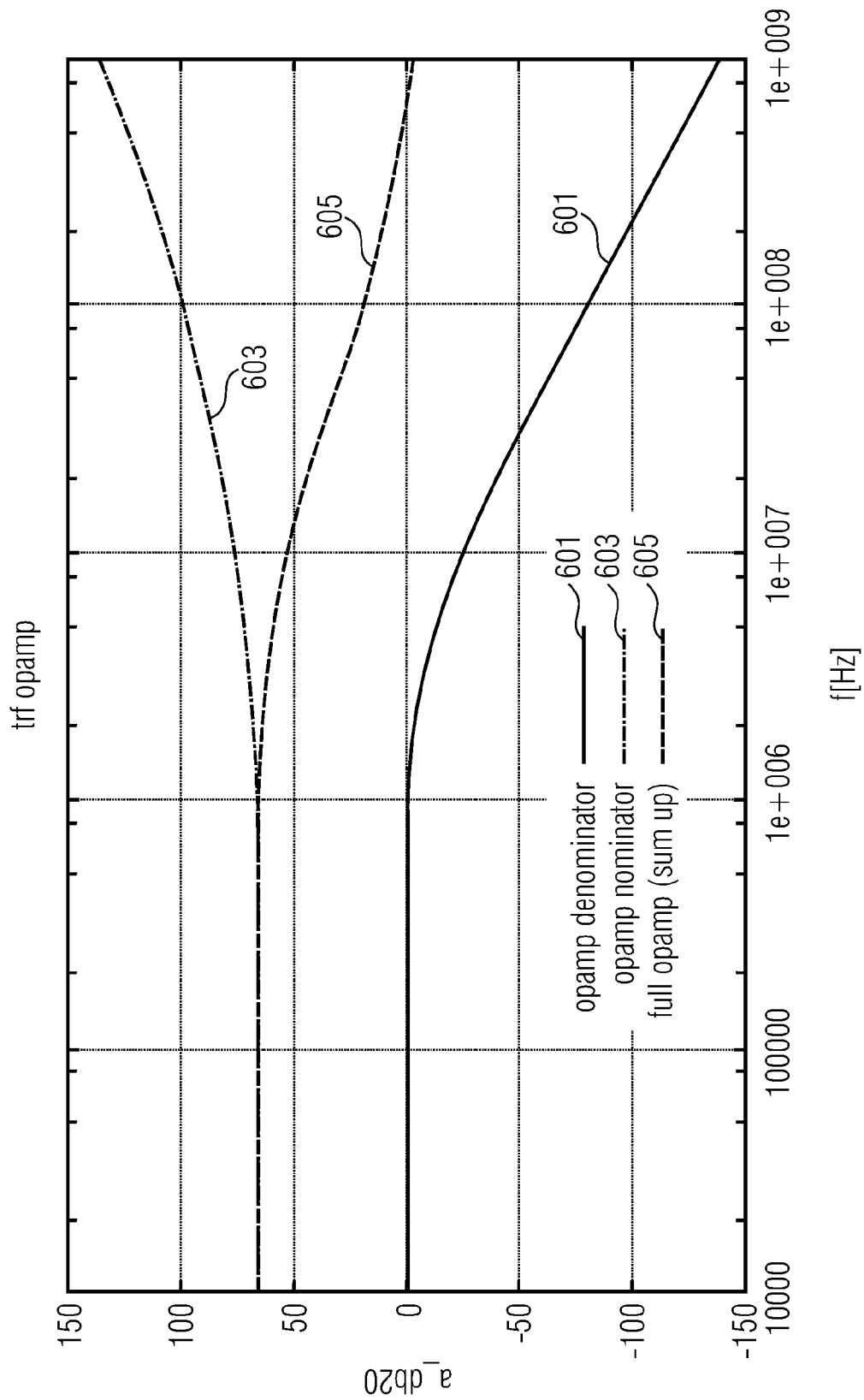
FIG. 6A shows an amplitude Bode plot of the transfer function and its nominator and denominator part of an example amplifier which is based on the small signal models as shown in FIG. 5.

FIG. 6A shows a resulting amplitude Bode plot of the above shown transfer function and its numerator and denominator part. From FIGS. 6A and 6B it can be seen that the implementation example of the amplifier 200 delivers the needed cutoff frequencies of the poles and zeros. In FIG. 6A a first curve 601 shows the amplitude Bode plot of the operational amplifier denominators part of the transfer function, a second curve 603 shows the amplitude Bode plot of the numerator part and a third curve 605 shows the amplitude Bode plot of the full transfer function.

Figure 6B:
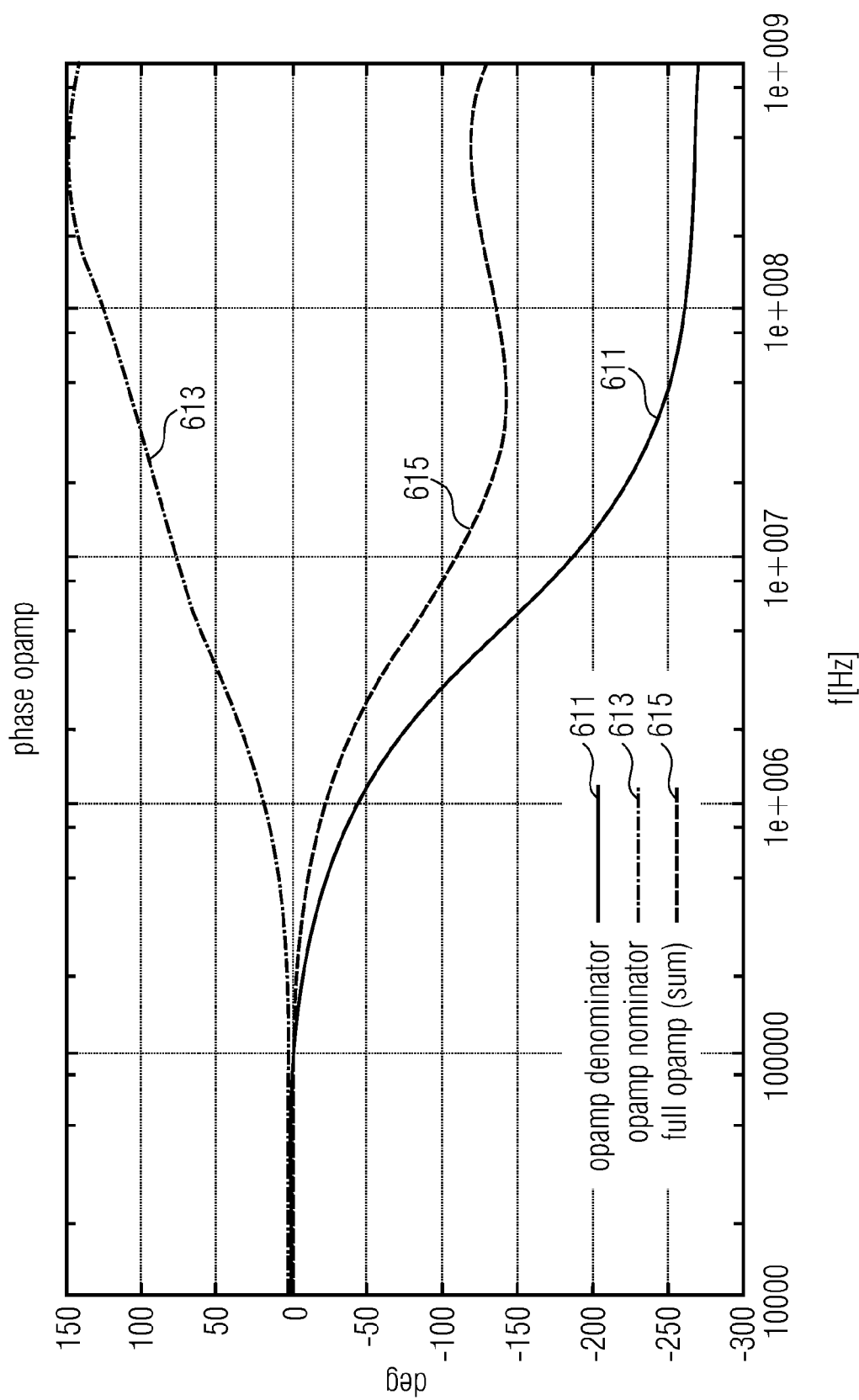
FIG. 6B shows a phase Bode plot of the transfer function and its numerator and denominator part of the example amplifier which is based on the small signal models shown in FIG. 5.

Furthermore, FIG. 6B shows a phase Bode plot of the transfer function and its numerator and denominator part. The phase Bode plot of the denominator part is shown in a first curve 611, the numerator part in a second curve 613 and of the full op-amp in a third curve 615. As seen in the phase Bode plot, the phase behavior of the numerator part (curve 613) helps to change the phase rollover of the complete transfer function such that at a gain of 0 dB the phase rollover is only around 140°.

Figure 6C:
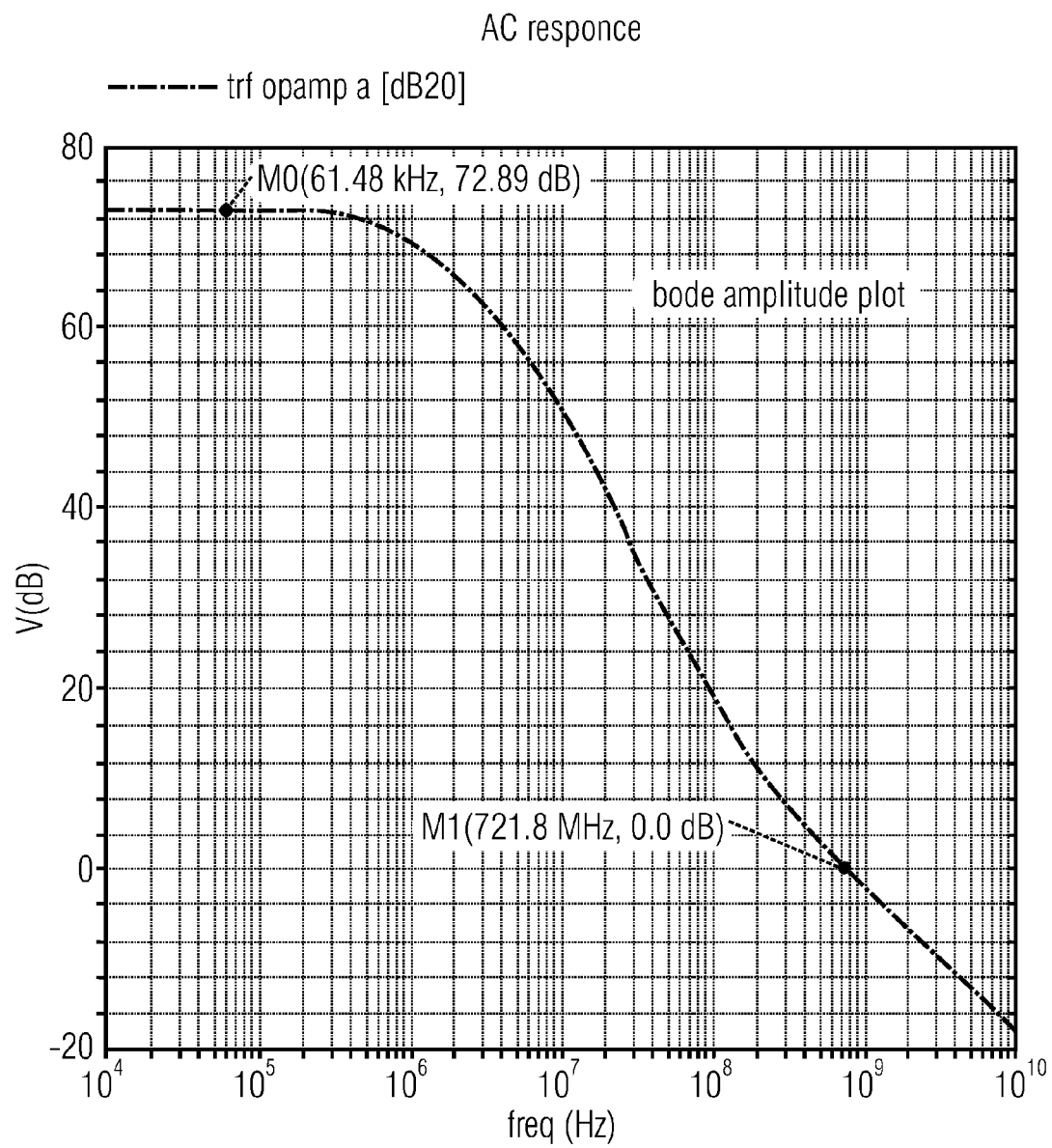
FIG. 6C shows the amplitude Bode plot of the transfer function of the example implementation of the amplifier shown in FIG. 4B1-4B2.
Figure 6D:
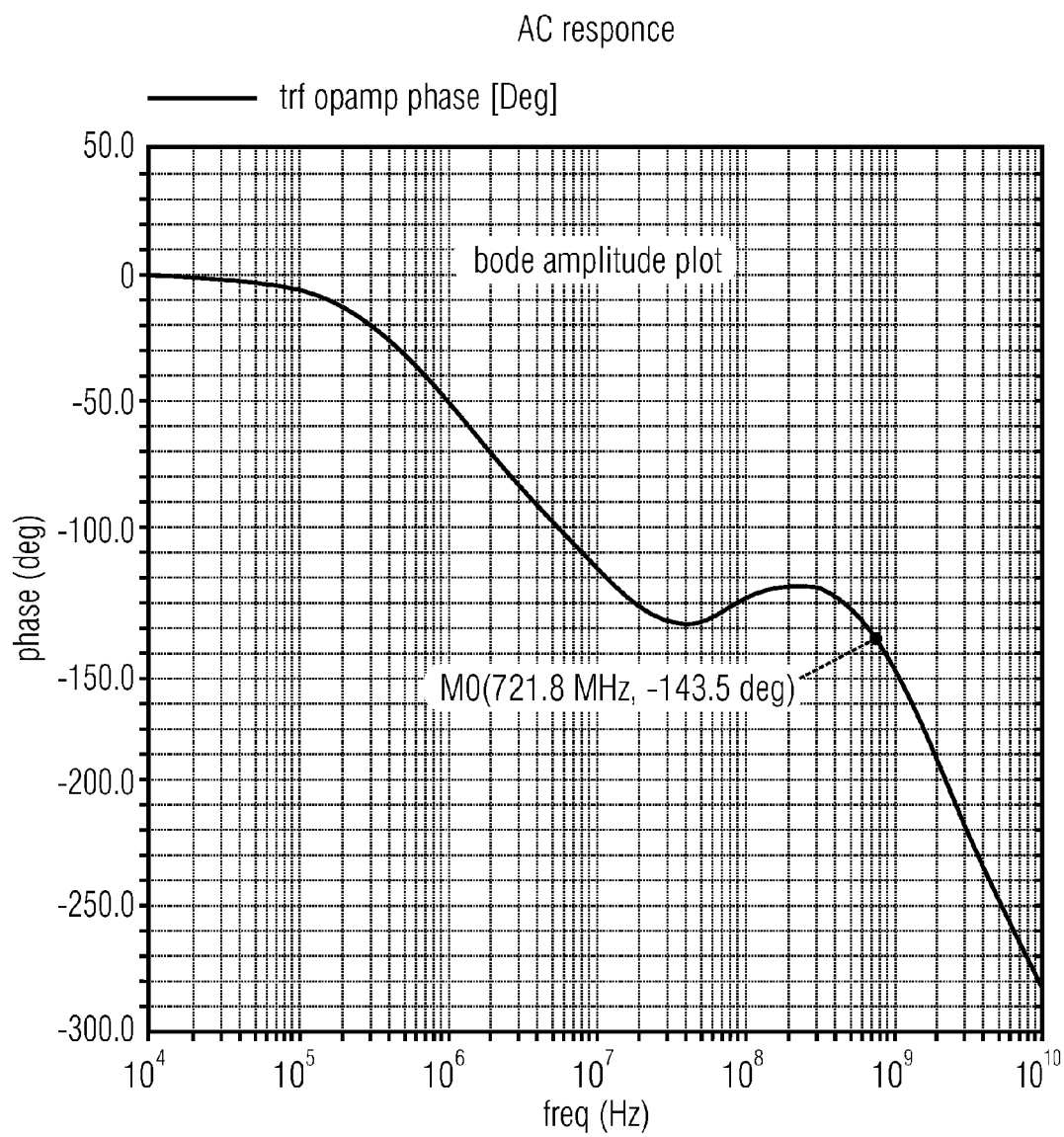
FIG. 6D shows the phase Bode phase plot of the transfer function of the example implementation of the amplifier shown in FIG. 4B1-4B2.

Furthermore, FIG. 6C shows the amplitude Bode plot of an AC simulation result for the amplifier 200 with the boundary conditions: schematics only at nominal conditions and room temperature in a C28 CMOS technology. Furthermore, the output of the operational amplifier was loaded with 360 Ohm single ended. FIG. 6D show the corresponding phase Bode phase plot for the AC simulation. From the diagrams in FIGS. 6C and 6D it can be seen that for a frequency of about 728.8 MHz (of the amplifier input signal 305) at a gain of 0 dB a phase rollover of −143.5° is achieved. Hence, for a gain of 0 dB a phase margin of around 40° is still provided.

With the implementation example of the amplifier 200 as shown in FIG. 4B1-4B2 the current consumption of the operational amplifier 200 can be achieved with approximately 2.8 mA at a supply voltage VDD of 1.1 V.

To summarize the above, the amplifier 200 is a multipath operational amplifier with enhanced noise, bandwidth and current consumption characteristics. The amplifier 200 can be used, for example, for active analog filter applications in cellular receive chains.

Figure 7:
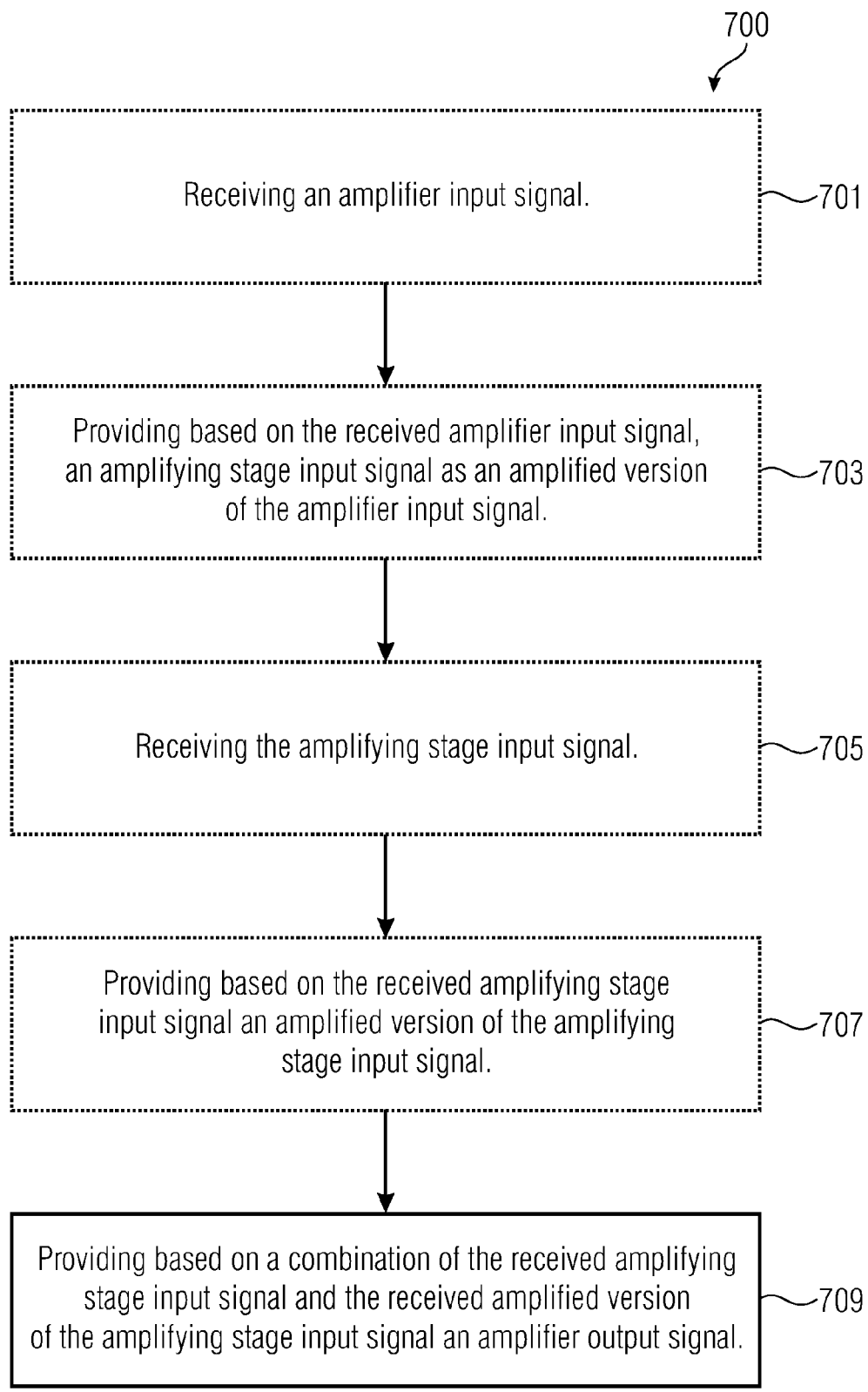
FIG. 7 shows a flow diagram of an example method for amplifying.

FIG. 7 shows a flow diagram of an example method 700. The method 700 comprises receiving an amplifier input signal at 701.

Furthermore, the method 700 comprises providing based on the received amplifier input signal, an amplifying stage input signal as an amplified version of the amplifier input signal at 703.

Furthermore, the method 700 comprises receiving the amplifying stage input signal at 705.

Furthermore, the method 700 comprises providing based on the received amplifying stage input signal an amplified version of the amplifying stage input signal at 707.

Furthermore, the method 700 comprises providing an amplifier output signal based on a combination of the received amplifying stage input signal and the received amplified version of the amplifying stage input signal at 709.

The acts 701, 703 can be performed, for example, by the input stage 301. The acts 705, 707 can be performed, for example, by the gain stage 303. The act 709 can be performed, for example, by the amplifying stage 201. Furthermore, the acts 701, 703, 705, 707 are optional steps. Hence, another example implementation of the method 700 may even comprise only the act 709 of providing an amplifier output signal based on a combination of a received amplifying stage input signal and a received amplified version of the amplifying stage input signal.

Furthermore, the present application relates to a use of an amplifier (such as the amplifier 200) comprising an amplifying stage configured to provide an amplifier output signal based on a combination of a received amplifying stage input signal and a received amplified version of the amplifying stage input signal, for processing mobile communication signals according to one or more mobile communication standards.

Such mobile communication signals can be, for example, from one or more of the following mobile communication standards: GSM, EDGE, UMTS, EGBP, LTE, WiFi, WiMAX, TD-SCDMA or Bluetooth.

Furthermore, during the use of the amplifier, the amplifier can be used for processing mobile communication signals according to the GSM mobile communication standard and furthermore according to the UMTS and/or LTE mobile communication standard.

Hence, it can be seen that the amplifier 200 can be used on the one hand for signals which have high requirements regarding low noise (such as GSM) and furthermore for signals which have high requirements regarding a high bandwidth (such as UMTS or LTE signals).

The method 700 may be supplemented by any of the features and functionalities described herein with respect to the apparatus, and may be implemented using the hardware components of the apparatus.

Although some aspects have been described in the context of an apparatus, it is clear that these aspects also represent a description of the corresponding method, where a block or device corresponds to a method act or a feature of a method act. Analogously, aspects described in the context of a method step also represent a description of a corresponding block or item or feature of a corresponding apparatus. Some or all of the method acts may be executed by (or using) a hardware apparatus, like for example, a microprocessor, a programmable computer or an electronic circuit. In some examples, some one or more of the most important method acts may be executed by such an apparatus.

Depending on certain implementation requirements, examples can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some examples comprise a data carrier having electronically readable control signals, which are capable of cooperating with a programmable computer system, such that one of the methods described herein is performed.

Generally, examples can be implemented as a computer program product with a program code, the program code being operative for performing one of the methods when the computer program product runs on a computer. The program code may for example be stored on a machine readable carrier.

Other examples comprise the computer program for performing one of the methods described herein, stored on a machine readable carrier.

In other words, an implementation of the example method is, therefore, a computer program having a program code for performing one of the methods described herein, when the computer program runs on a computer.

A further implementation of the example method is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitory.

A further implementation of the example method is, therefore, a data stream or a sequence of signals representing the computer program for performing one of the methods described herein. The data stream or the sequence of signals may for example be configured to be transferred via a data communication connection, for example via the Internet.

A further example comprises a processing means, for example a computer, or a programmable logic device, configured to or adapted to perform one of the methods described herein.

A further example comprises a computer having installed thereon the computer program for performing one of the methods described herein.

A further example comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some examples, a programmable logic device (for example a field programmable gate array) may be used to perform some or all of the functionalities of the methods described herein. In some examples, a field programmable gate array may cooperate with a microprocessor in order to perform one of the methods described herein. Generally, the methods are preferably performed by any hardware apparatus.

The above described examples are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the examples herein.

Although each claim only refers back to one single claim, the disclosure also covers any conceivable combination of claims.

The invention claimed is:

1. An amplifier, comprising:
   an amplifying stage configured to provide an amplifier output signal based on a received amplifying stage input signal and a received amplified version of the amplifying stage input signal;
   a gain stage configured to receive the amplifying stage input signal and provide the amplified version of the amplifying stage input signal based on the received amplifying stage input signal;
   wherein the gain stage comprises an amplifying element and a biasing element;
   wherein the amplifying element of the gain stage is configured to receive the amplifying stage input signal or at least a differential component of the amplifying stage input signal and provide based on the received amplifying stage input signal or the differential component of the amplifying stage input signal and a gain stage bias provided by the biasing element the amplified version of the amplifying stage input signal or at least a differential component of the amplified version of the amplifying stage input signal;
   wherein the amplifying element of the gain stage comprises a transistor;
   wherein a control terminal of the transistor of the gain stage is configured to receive the amplifying stage input signal or at least the differential component of the amplifying stage input signal;
   wherein the transistor of the gain stage is configured to provide the amplified version of the amplifying stage input signal or at least a differential component of the amplified version of the amplifying stage input signal at a first terminal of the transistor of the gain stage;
   wherein the biasing element of the gain stage is configured to provide the gain stage bias at the first terminal of the transistor of the gain stage;
   wherein the gain stage comprises a further biasing element configured to provide a further gain stage bias at a second terminal of the transistor of the gain stage.

2. The amplifier according to claim 1:
   wherein the amplifying stage comprises a first amplifying element and a second amplifying element;
   wherein the amplifying stage is configured to provide the amplifier output signal or at least a differential component of the amplifier output signal at a common terminal of the first amplifying element and the second amplifying element; and
   wherein the first amplifying element is configured to receive at a control terminal of the first amplifying element the amplifying stage input signal or at least a differential component of the amplifying stage input signal and wherein the second amplifying element is configured to receive at a control terminal of the second amplifying element the amplified version of the amplifying stage input signal or at least a differential component of the amplified version of the amplifying stage input signal.

3. The amplifier according to claim 2, wherein the first amplifying element and the second amplifying element of the amplifying stage are complementary to each other.

4. The amplifier according to claim 2, wherein for equal input signals at the control terminals of the first amplifying element and the second amplifying element an output signal provided by the first amplifying element at the common terminal is inverse to an output signal provided by the second amplifying element at the common terminal.

5. The amplifier according to claim 2, wherein the first amplifying element is a first transistor of a first type and the second amplifying element is a second transistor of a second type, the first type of transistor being complementary to the second type of transistor.

6. The amplifier according to claim 1, wherein the amplifier does not comprise a capacitance for frequency or phase compensation.

7. The amplifier according to claim 1, wherein the amplifying stage is configured to receive the amplifying stage input signal and the amplified version of the amplifying stage input signal as differential signals and provide the amplifier output signal as a differential signal.

8. An amplifier, comprising:
   an amplifying stage configured to provide an amplifier output signal based on a received amplifying stage input signal and a received amplified version of the amplifying stage input signal;
   an input stage configured to receive an amplifier input signal and provide based on a received amplifier input signal, the amplifying stage input signal as an amplified version of the amplifier input signal; and
a gain stage, the gain stage comprising a transistor and a further biasing element;
  wherein the input stage comprises an amplifying element and a biasing element; and
  wherein the amplifying element of the input stage is configured to receive the amplifier input signal or at least a differential component of the amplifier input signal and provide based on the received amplifier input signal or the received differential component of the amplifier input signal and an input stage bias provided by the biasing element of the input stage the amplifying stage input signal;
  wherein the amplifying element of the input stage is or comprises a transistor;
  wherein a control terminal of the transistor of the input stage is configured to receive the amplifier input signal;
  wherein the transistor of the input stage is configured to provide the amplifying stage input signal at a first terminal of the transistor of the input stage; and
  wherein the biasing element of the input stage is configured to provide the input stage bias at the first terminal of the transistor of the input stage;
  wherein the input stage comprises a further biasing element configured to provide a further input stage bias at a second terminal of the transistor of the input stage;
  wherein a control terminal of the transistor of the gain stage is configured to receive the amplifying stage input signal or at least a differential component of the amplifying stage input signal;
  wherein the transistor of the gain stage is configured to provide the amplified version of the amplifying stage input signal or least a differential component of the amplified version of the amplifying stage input signal at the first terminal of the transistor of the gain stage;
  wherein the further biasing element of the gain stage is configured to provide a further gain stage bias at the second terminal of the transistor of the gain stage based on a potential at a control terminal of the further biasing element of the gain stage;
  wherein the further biasing element of the input stage is configured to provide the further input stage bias based on a potential at a control terminal of the further biasing element of the input stage; and
wherein the control terminal of the further biasing element of the input stage and the control terminal of the further biasing element of the gain stage are connected to each other.

9. An amplifier, comprising:
  an input stage configured to receive an amplifier input signal as a differential signal and provide an amplifying stage input signal as an amplified version of the amplifier input signal, the amplifying stage input signal being a differential signal;
  a gain stage configured to receive the amplifying stage input signal and provide an amplified version of the amplifying stage input signal as a differential signal; and
  an amplifying stage configured to receive the amplifying stage input signal and the amplified version of the amplifying stage input signal and provide an amplifier output signal as a differential signal based on a combination of the received amplifying stage input signal and the received amplified version of the amplifying stage input signal;
  wherein the input stage comprises a first transistor of a first type of transistors, and a second transistor of the first type of transistors;
  wherein the gain stage comprises a third transistor of the first type of transistors, and a fourth transistor of the first type of transistors; and
  wherein the amplifying stage comprises a fifth transistor of the first type of transistors, a sixth transistor of the first type of transistors, a seventh transistor of a second type of transistors, the second type of transistors being complementary to the first type of transistors, and an eighth transistor of the second type of transistors;
  wherein a control terminal of the first transistor is configured to receive a first differential component of a differential amplifier input signal and a second control terminal of the second transistor is configured to receive a second differential component of the differential amplifier input signal;
  wherein a control terminal of the third transistor and a control terminal of the seventh transistor are connected to a first terminal of the second transistor;
  wherein a control terminal of the fourth transistor and a control terminal of the eighth transistor are connected to a first terminal of the first transistor;
  wherein a control terminal of the fifth transistor is connected to a first terminal of the fourth transistor;
  wherein a control terminal of the sixth transistor is connected to a first terminal of the third transistor;
  wherein the eighth transistor and the sixth transistor are configured to provide at a common terminal of the eighth transistor and the sixth transistor a first differential component of a differential amplifier output signal; and
  wherein the seventh transistor and the fifth transistor are configured to provide at a common terminal of the seventh transistor and the fifth transistor a second differential component of the differential amplifier output signal.

10. The amplifier according to claim 9, further comprising:
a first biasing transistor connected between second terminals of the first transistor and the second transistor and a ground potential terminal of the amplifier; and
a second biasing transistor connected between second terminals of the third transistor and the fourth transistor and the ground potential terminal;
wherein control terminals of the first biasing transistor and the second biasing transistor are shorted together.

* * * * *